(12) United States Patent
Yamamoto et al.

(10) Patent No.: US 10,727,172 B2
(45) Date of Patent: Jul. 28, 2020

(54) SEMICONDUCTOR PACKAGE

(71) Applicant: ROHM CO., LTD., Kyoto (JP)

(72) Inventors: Isao Yamamoto, Kyoto (JP); Yuichi Shinozaki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/210,157

(22) Filed: Dec. 5, 2018

(65) Prior Publication Data

US 2019/0181078 A1 Jun. 13, 2019

(30) Foreign Application Priority Data

Dec. 8, 2017 (JP) .................................. 2017-235683

(51) Int. Cl.
*H01L 23/495* (2006.01)
(52) U.S. Cl.
CPC .. *H01L 23/49562* (2013.01); *H01L 23/49524* (2013.01); *H01L 23/49541* (2013.01); *H01L 23/49575* (2013.01); *H01L 23/49568* (2013.01); *H01L 2224/0603* (2013.01); *H01L 2224/40139* (2013.01); *H01L 2224/40245* (2013.01); *H01L 2224/48137* (2013.01); *H01L 2224/48247* (2013.01); *H01L 2224/49171* (2013.01); *H01L 2924/181* (2013.01)

(58) Field of Classification Search
CPC ............... H01L 23/13; H01L 23/49575; H01L 23/49562; H01L 23/49548; H01L 23/49513; H01L 23/49524; H01L 23/49568; H01L 23/49551; H01L 2224/49171; H01L 2924/00014; H01L 2224/48247; H01L 2224/48137; H01L 2224/0603; H01L 2224/40139; H01L 2224/40245; H01L 2924/181; H01L 23/49541; H01L 2924/00012

See application file for complete search history.

(56) References Cited

U.S. PATENT DOCUMENTS 7,271,470 B1 * 9/2007 Otremba ............... H01L 23/492
257/666
2005/0161785 A1 * 7/2005 Kawashima ...... H01L 23/49562
257/678

FOREIGN PATENT DOCUMENTS

JP 2009534869 A 9/2009

* cited by examiner

*Primary Examiner* — Jasmine J Clark
(74) *Attorney, Agent, or Firm* — Cantor Colburn LLP

(57) ABSTRACT

There is provided a semiconductor package including a mounting frame having a conductive chip mounting region, a first semiconductor chip mounted on the chip mounting region and including a first semiconductor element, a second semiconductor chip mounted on the chip mounting region and including a second semiconductor element, and a conductive clip of a plate shape. The conductive clip includes a first component disposed above the mounting frame with the first semiconductor chip interposed therebetween, and a second component separated from the first component and disposed above the mounting frame with the second semiconductor chip interposed therebetween. The second main electrode of the first semiconductor element and the first main electrode of the second semiconductor element are short-circuited by the chip mounting region, so that the first semiconductor element and the second semiconductor element are cascade-connected.

8 Claims, 3 Drawing Sheets

SEMICONDUCTOR PACKAGE

CROSS-REFERENCE TO RELATED APPLICATION

The present application claims priority under 35 U.S.C. § 119 to Japanese Patent Application No. 2017-235683, filed on Dec. 8, 2017, the entire contents of which are incorporated herein by reference.

TECHNICAL FIELD

The present disclosure relates to a semiconductor package on which a semiconductor chip including a semiconductor element is mounted.

BACKGROUND

A semiconductor package on which a semiconductor chip is mounted has been developed for higher performance and higher quality. For example, a semiconductor package, which is configured to interpose a semiconductor chip between a mounting frame and a conductive clip of a plate shape, is used as a semiconductor package for an analog power device or the like.

By using a conductive clip for electrical connection, it is possible to realize lower impedance of the semiconductor package than a case of using a bonding wire or the like. In addition, by using a conductive clip of a plate shape, it is possible to improve heat dissipation of a semiconductor package.

However, since it is configured to draw the output of the semiconductor chip into a terminal of the semiconductor package via the conductive clip, there arises a problem that the low impedance of an output path is limited.

SUMMARY

Some embodiments of the present disclosure provide a semiconductor package that uses a conductive clip and can lower the impedance of an output path.

According to one embodiment of the present disclosure, there is provided a semiconductor package including: a mounting frame having a conductive chip mounting region; a first semiconductor chip mounted on the chip mounting region and includes a first semiconductor element in which a main current flows between a first main electrode and a second main electrode in a turn-on state; a second semiconductor chip mounted on the chip mounting region and includes a second semiconductor element in which a main current flows between a first main electrode and a second main electrode in a turn-on state; and a conductive clip of a plate shape. The conductive clip includes a first component disposed above the mounting frame with the first semiconductor chip interposed between the first component and the mounting frame; and a second component separated from the first component and disposed above the mounting frame with the second semiconductor chip interposed between the second component and the mounting frame. The second main electrode of the first semiconductor element and the first main electrode of the second semiconductor element are short-circuited by the chip mounting region, so that the first semiconductor element and the second semiconductor element are cascade-connected.

DETAILED DESCRIPTION

Figure 1:
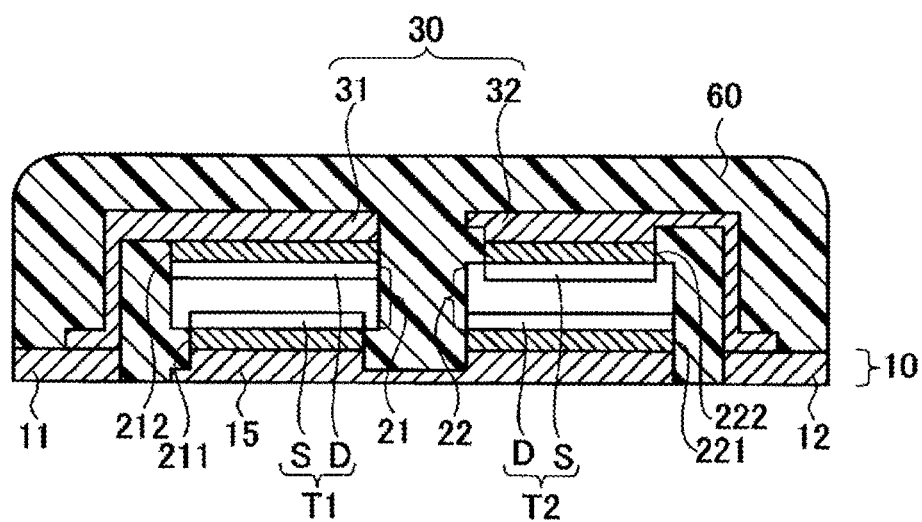
FIG. 1 is a schematic sectional view showing a configuration of a semiconductor package according to an embodiment.

Embodiments will be now described with reference to the drawings. Throughout the drawings, the same or similar parts are denoted by the same or similar reference numerals. However, it should be noted that the drawings are schematic and the relationship between the thickness and the planar dimensions, the ratio of the thicknesses of various parts and the like are different from the actual ones. In addition, it is a matter of course that the drawings also include parts having different relationships and ratios of dimensions.

In addition, the following embodiments exemplify apparatuses and methods for embodying the technical idea of the present disclosure and do not specify the material, shape, structure, arrangement, etc. of the constituent parts. Various modifications can be made to the embodiments in the claims.

As shown in FIG. 1, a semiconductor package according to an embodiment includes a mounting frame 10 having a conductive chip mounting region 15, a first semiconductor chip 21 and a second semiconductor chip 22, which are mounted on the chip mounting region 15, and a conductive clip 30 of a plate shape, which is disposed above the mounting frame 10. The mounting frame 10 and the conductive clip 30 are disposed such that the first semiconductor chip 21 and the second semiconductor chip 22 are interposed therebetween.

The conductive clip 30 includes a first component 31 disposed above the mounting frame 10 with the first semiconductor chip 21 interposed therebetween, and a second component 32 disposed above the mounting frame 10 with the second semiconductor chip 22 interposed therebetween. The first component 31 and the second component 32 are separated from each other.

The first semiconductor chip 21 includes a first semiconductor element T1 through which a main current flows between a first main electrode and a second main electrode, in a turn-on state. The second semiconductor chip 22 includes a second semiconductor element T2 through which a main current flows between a first main electrode and a second main electrode, in a turn-on state.

The first semiconductor element T1 and the second semiconductor element T2 are vertical semiconductor elements. That is, in each of the first semiconductor chip 21 and the second semiconductor chip 22, the first main electrode and the second main electrode are disposed on main surfaces, which face each other, respectively. Hereinafter, a case where the first semiconductor element T1 and the second semiconductor element T2 are n-channel MOSFETs will be described. In FIG. 1, the first main electrode of each of the first semiconductor element T1 and the second semiconductor element T2 is denoted as a drain D, and the second main electrode thereof is denoted as a source S (the same applies hereinafter). Although not shown in FIG. 1, a gate G is disposed on the same main surface with the source S.

The chip mounting region 15 of the mounting frame 10 is connected to an output terminal (not shown in FIG.). The source S, which is the second main electrode of the first semiconductor element T1, and the drain D, which is the first main electrode of the second semiconductor element T2, are in contact with the chip mounting region 15.

That is, the first semiconductor chip 21 is flip-chip mounted on the mounting frame 10 such that the source S of the first semiconductor element T1 faces the mounting frame 10. The second semiconductor chip 22 is flip-chip mounted on the mounting frame 10 such that the drain D of the second semiconductor element T2 faces the mounting frame 10.

A conductive adhesive containing metal such as tin (Sn), lead (Pb) or silver (Ag), or an alloy thereof is used for bonding the first semiconductor chip 21 and the second semiconductor chip 22 to the mounting frame 10, and for bonding the first semiconductor chip 21 and the second semiconductor chip 22 to the conductive clip 30. For example, solder bonding is used for this bonding. In the example shown in FIG. 1, the first semiconductor chip 21 and the mounting frame 10 are bonded by a bonding material 211, and the second semiconductor chip 22 and the mounting frame 10 are bonded by a bonding material 221. The first semiconductor chip 21 and the first component 31 of the conductive clip 30 are bonded by a bonding material 212, and the second semiconductor chip 22 and the second component 32 of the conductive clip 30 are bonded by a bonding material 222.

As shown in FIG. 1, the mounting frame 10 has a first power supply terminal 11 and a second power supply terminal 12. The drain D of the first semiconductor element T1 and the first power supply terminal 11 are electrically connected via the first component 31 of the conductive clip 30. The source S of the second semiconductor element T2 and the second power supply terminal 12 are electrically connected via the second component 32 of the conductive clip 30.

The end portion of the conductive clip 30 is bent as shown in FIG. 1. That is, the conductive clip 30 is bent along the end portions of the first semiconductor chip 21 and the second semiconductor chip 22 and extends toward the mounting frame 10.

By being bent toward the mounting frame 10 in this manner, the end portion of the first component 31 of the conductive clip 30 is connected to the first power supply terminal 11 of the mounting frame 10. The end portion of the second component 32 of the conductive clip 30 is connected to the second power supply terminal 12 of the mounting frame 10.

The conductive clip 30 may be made of copper (Cu), aluminum (Al), silver (Ag) or the like having good conductivity. For example, a Cu plate having a thickness of about 200 μm may be used for the conductive clip 30.

In addition, it is desirable that the mounting frame 10, on which the first semiconductor chip 21 and the second semiconductor chip 22 are mounted, is covered with a sealing material, by resin molding or the like. For example, there may be protection of the semiconductor chips, reinforcement of the semiconductor package and the like by mold sealing with an epoxy resin or the like. An example in which the semiconductor package is mold-sealed by the molding material 60 is shown in FIG. 1.

Figure 2:
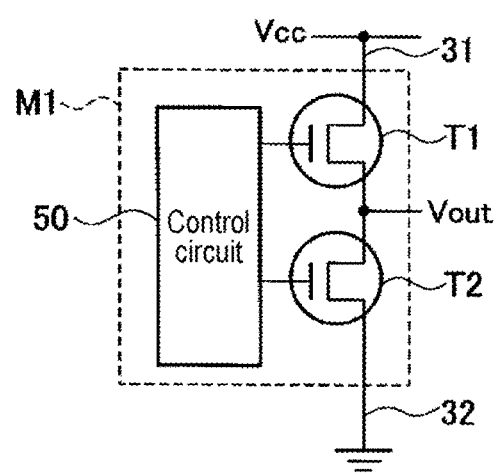
FIG. 2 is a circuit diagram of an output module constituted by a semiconductor chip mounted on a semiconductor package according to an embodiment.

As described above, in the semiconductor package shown in FIG. 1, the source S of the first semiconductor element T1 and the drain D of the second semiconductor element T2 are short-circuited by the chip mounting region 15, so that the first semiconductor element T1 and the second semiconductor elements T2 are cascade-connected. Therefore, for example, an output module M1 shown in FIG. 2 is configured as the semiconductor package. In the output module M1, the first power supply terminal 11 is a power supply terminal to which a power supply voltage Vcc for driving the first semiconductor element T1 and the second semiconductor element T2 is applied. Further, the second power supply terminal 12 is a ground terminal (GND terminal). A connection point between the source S of the first semiconductor element T1 and the drain D of the second semiconductor element T2 is an output terminal.

The output module M1 shown in FIG. 2 includes a control circuit 50 that controls the turning-on/off operation of each of the first semiconductor element T1 and the second semiconductor element T2. By mounting a controller chip, in which the control circuit 50 is integrated, on the mounting frame 10, the output module M1 including two MOSFETs and a control circuit for driving these MOSFETs can be realized as one semiconductor package.

The output module M1 shown in FIG. 2 has a configuration in which the first semiconductor element T1 is a high-side switching element and the second semiconductor element T2 is a low-side switching element. For example, a power supply device, which supplies an output voltage Vout from the connection point between the high-side switching element and the low-side switching element, can be configured by using the output module M1.

Figure 3:
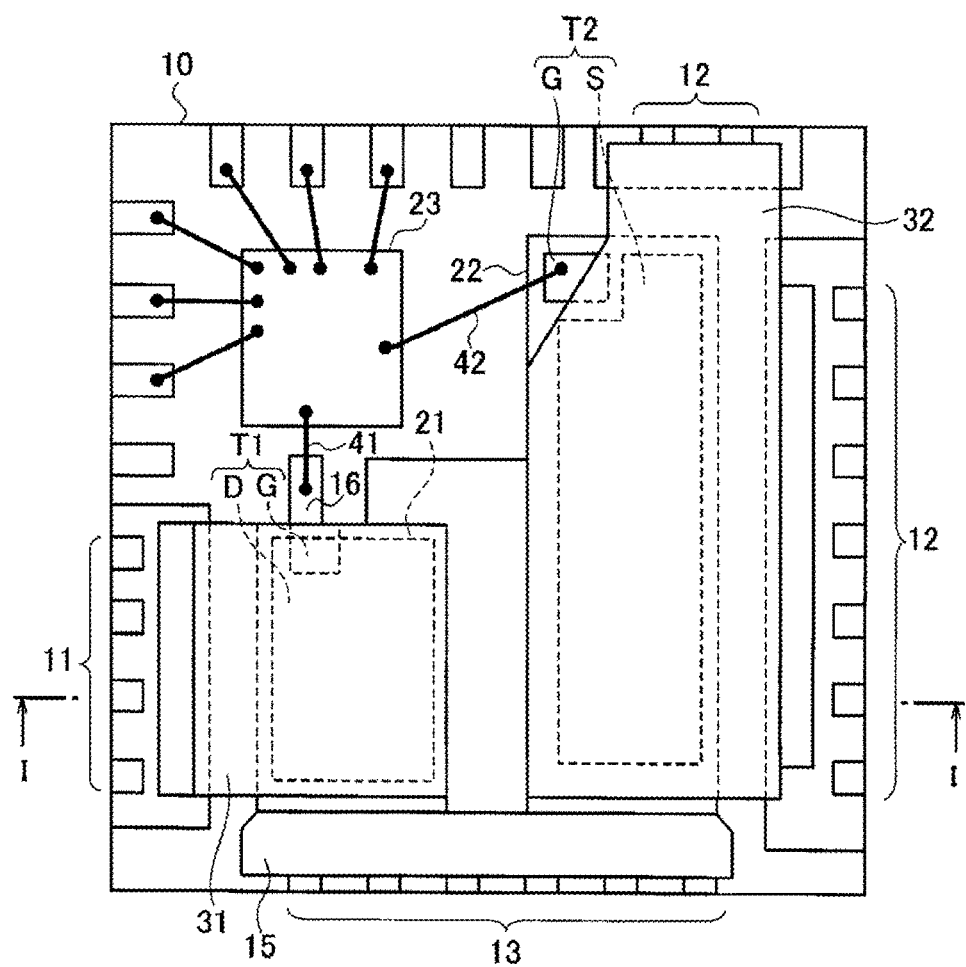
FIG. 3 is a schematic plan view showing a configuration of a semiconductor package according to an embodiment.

FIG. 3 shows a layout example of a semiconductor package on which the first semiconductor chip 21, the second semiconductor chip 22, and the controller chip 23 including the control circuit 50 are mounted. FIG. 1 is a sectional view taken along line I-I in FIG. 3.

The gate G of the first semiconductor element T1 is disposed on the same main surface with the source S thereof and is in contact with a gate connection region 16 of the mounting frame 10. The gate connection region 16 is electrically connected to the controller chip 23 by a bonding wire 41. Further, the gate G of the second semiconductor element T2 is electrically connected to the controller chip 23 by a bonding wire 42. The chip mounting region 15 is connected to an output terminal 13.

Figure 4:
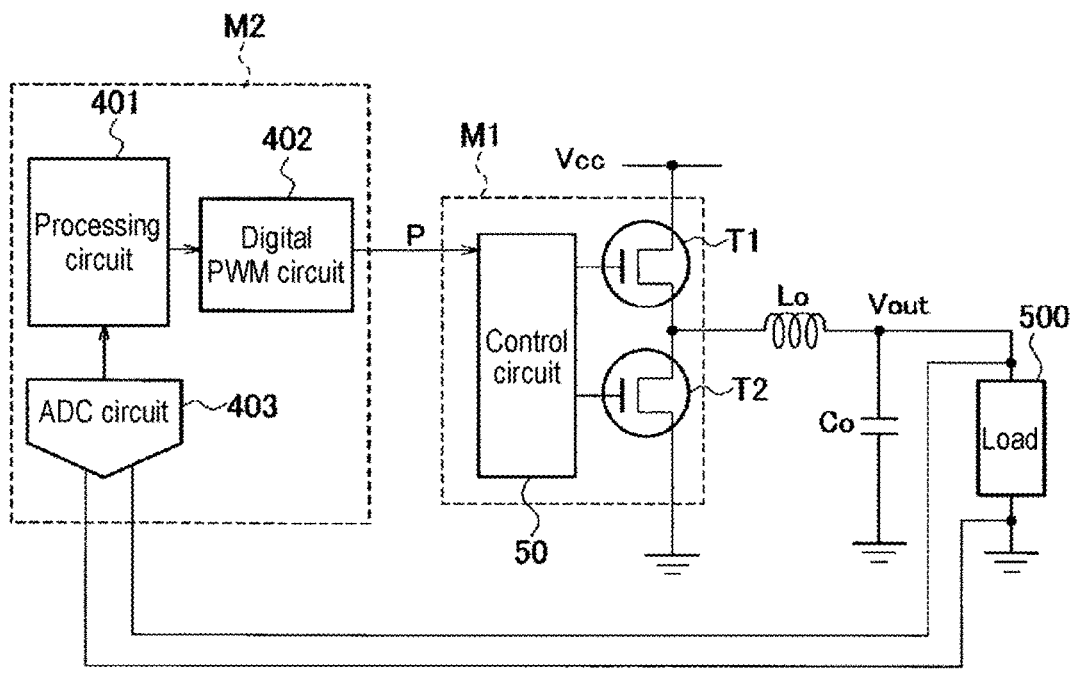
FIG. 4 is a circuit diagram of a power supply device configured using a semiconductor package according to an embodiment.

FIG. 4 shows an example in which the output module M1 shown in FIG. 2 is used as a part of a power supply device. The power supply device shown in FIG. 4 includes the output module M1 and a control module M2 for controlling the output module M1. The control module M2 includes a processing circuit 401, a digital PWM circuit 402 that outputs a pulse signal subjected to PWM (Pulse Width Modulation), and an ADC circuit 403 that performs analog-digital conversion on an electric signal.

As will be described below, the processing circuit 401 controls the digital PWM circuit 402 according to a voltage output from the output module M1.

The digital PWM circuit 402 generates a pulse signal P based on a signal from the processing circuit 401. The pulse signal P is transmitted to the control circuit 50 of the output module M1.

The control circuit 50 controls on/off operations of the first semiconductor element T1 and the second semiconductor element T2 according to the pulse signal P from the digital PWM circuit 402. As a result, a predetermined output voltage Vout is supplied from the output module M1.

As shown in FIG. 4, an output capacitor Co and a load 500 are connected between the connection point between the first semiconductor element T1 and the second semiconductor element T2 and the ground (GND) via an inductor Lo. The load 500 is, for example, a CPU (central processing unit), a memory device such as a DDR SDRAM, an ASIC (Application Specific Integrated Circuit), an FPGA (Field Programmable Gate Array), a DSP (Digital Signal Processor), a motor control IC or the like. In the power supply device shown in FIG. 4, the connection point between the inductor Lo and the output capacitor Co is an output terminal to output the output voltage Vout, which is supplied to the load 500.

The ADC circuit 403 monitors the output voltage Vout, converts the output voltage Vout into a digital value, and outputs the digital value to the processing circuit 401. The processing circuit 401 controls the digital PWM circuit 402 according to a difference between the output voltage Vout monitored by the ADC circuit 403 and a target output voltage so as to adjust the output voltage Vout to a constant value. As described above, it is possible to set the output voltage Vout to the target output voltage by the PWM control by the power supply device shown in FIG. 4.

Figure 5:
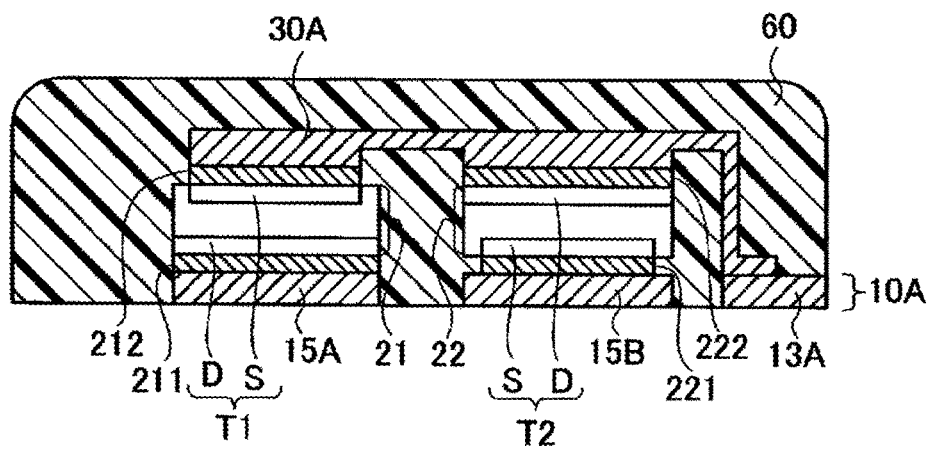
FIG. 5 is a schematic sectional view showing a configuration of a semiconductor package of a comparative example.

FIG. 5 shows the configuration of a semiconductor package of a comparative example. In the comparative example shown in FIG. 5, a first semiconductor chip 21 and a second semiconductor chip 22 are interposed between a mounting frame 10A and a conductive clip 30A. In addition, as in the circuit shown in FIG. 2, a first semiconductor element T1 and a second semiconductor element T2 are cascade-connected. That is, the source S of the first semiconductor element T1 and the drain D of the second semiconductor element T2 are connected to each other.

However, the semiconductor package of the comparative example and the semiconductor package shown in FIG. 1 are different from each other in terms of the orientations of the top and bottom of the semiconductor chip and the positions connected by the conductive clip 30A. That is, the first semiconductor chip 21 is flip-chip mounted on a chip mounting region 15A of the mounting frame 10A such that the drain D of the first semiconductor element T1 faces the mounting frame 10A. In addition, the second semiconductor chip 22 is flip-chip mounted on a chip mounting region 15B of the mounting frame 10A such that the source S of the second semiconductor element T2 faces the mounting frame 10A. The chip mounting region 15A and the chip mounting region 15B are insulated from each other. In addition, the source S of the first semiconductor element T1 and the drain D of the second semiconductor element T2 are in contact with the conductive clip 30A.

Further, the first semiconductor chip 21 and the chip mounting region 15A are bonded by a bonding material 211, and the second semiconductor chip 22 and the chip mounting region 15B are bonded by a bonding material 221. The source S of the first semiconductor element T1 and the conductive clip 30A are bonded by a bonding material 212, and the drain D of the second semiconductor element T2 and the conductive clip 30A are bonded by a bonding material 222.

In the semiconductor package of the comparative example, for example, the chip mounting region 15A is connected to a power supply terminal to which a power supply voltage is applied, and the chip mounting region 15B is connected to the ground terminal. As a result, as shown in FIG. 2, a circuit in which the first semiconductor element T1 and the second semiconductor element T2 are cascade-connected is formed between the power supply terminal and the ground terminal.

As described above, in the semiconductor package of the comparative example shown in FIG. 5, the first semiconductor element T1 and the second semiconductor element T2 are connected by the conductive clip 30A. This point is different from the semiconductor package in which the first semiconductor element T1 and the second semiconductor element T2 are connected by the mounting frame 10 according to the embodiment shown in FIG. 1.

In the semiconductor package of the comparative example, the output terminal, which is the connection point between the first semiconductor element T1 and the second semiconductor element T2, is connected to the conductive clip 30A. In addition, the conductive clip 30A is connected to an output terminal 13A of the semiconductor package. That is, the conductive clip 30A is included in an output path extending from the output terminal to the output terminal 13A of the semiconductor package.

On the other hand, in the semiconductor package shown in FIG. 1, the output terminal, which is the connection point between the first semiconductor element T1 and the second semiconductor element T2, is in contact with the chip mounting region 15 of the mounting frame 10. That is, the conductive clip 30 is not included in an output path extending from the output terminal to the output terminal 13 of the semiconductor package.

That is, in the semiconductor package according to the embodiment, unlike the comparative example, the output terminal is directly connected to the mounting frame 10. Therefore, it is possible to suppress parasitic resistance and parasitic inductance of the output path by the semiconductor package shown in FIG. 1. As a result, it is possible to lower the impedance of the output path.

In addition, in the semiconductor package of the comparative example shown in FIG. 5, the mounting frame 10A is separated into the chip mounting region 15A and the chip mounting region 15B. Therefore, the shape of a terminal exposed at the lower side of the outside of the semiconductor package is also separated from the mounting frame 10A. That is, the area of the terminal is reduced by an amount corresponding to a distance between the chip mounting region 15A and the chip mounting region 15B. Since the area of the terminal influences heat dissipation, maximization of the heat dissipation of the semiconductor package of the comparative example is limited.

In contrast, in the semiconductor package shown in FIG. 1, since the first semiconductor element T1 and the second semiconductor element T2 are mounted on a single chip mounting region 15, the area of a terminal exposed at the lower side of the outside of the semiconductor package can be larger than that of the comparative example. Therefore, the heat dissipation can be improved by the semiconductor package according to the embodiment.

The semiconductor package according to the embodiment is formed as follows, for example. First, the mounting frame 10, which includes the first power supply terminal 11, the second power supply terminal 12, the output terminal 13 and the chip mounting region 15, is prepared.

Next, a semiconductor chip is mounted on the mounting frame 10. At this time, as described previously, the first semiconductor chip 21 and the second semiconductor chip 22 are flip-chip mounted on the mounting frame 10 such that the source S of the first semiconductor element T1 and the drain D of the second semiconductor element T2 are in contact with the chip mounting region 15.

Next, predetermined wire bonding is performed. That is, the gate G of the second semiconductor element T2 and the controller chip 23 are electrically connected to each other. Further, the gate connection region 16 of the mounting frame 10 and the controller chip 23 are electrically connected to each other.

Thereafter, the first component 31 of the conductive clip 30 is disposed such that the drain D of the first semiconductor element T1 is connected with the first power supply terminal 11 of the mounting frame 10. Further, the second component 32 of the conductive clip 30 is disposed such that the source S of the second semiconductor element T2 is connected with the second power supply terminal 12 of the mounting frame 10.

Thus, a semiconductor package that uses the conductive clip 30 and can lower the impedance of the output path is formed.

Other Embodiments

Although the embodiments have been described as above, it should not be understood that the description and drawings forming a part of the present disclosure limit the embodiments. From the present disclosure, various alternative embodiments, examples and operational techniques will be apparent to those skilled in the art.

For example, in the description of the above-described embodiments, there has been presented the example in which the output module M1 including the two MOSFETs and the control circuit for controlling these MOSFETs is realized by one semiconductor package. However, other configurations may be realized by one semiconductor package. For example, only two semiconductor chips, each including a MOSFET, may be mounted on a semiconductor package. Alternatively, the entire power supply device shown in FIG. 4 may be realized by one semiconductor package.

In addition, there has been described the case where the first semiconductor element T1 and the second semiconductor element T2 are n-channel type MOSFETs. However, these semiconductor elements may be p-channel type MOSFETs. Alternatively, other types of FETs or transistors may be used.

Further, in FIG. 4, there has been shown the case where the control module M2 is constituted by a digital circuit. However, the control module M2 is not limited thereto. For example, the control module M2 may be constituted by an analog circuit such as an error amplifier, a PWM comparator for comparing the output voltage Vout and the internal reference voltage or the like.

INDUSTRIAL APPLICABILITY

The semiconductor package of this embodiment can be used for all packages on which a semiconductor chip is mounted.

According to the present disclosure in some embodiments, it is possible to provide a semiconductor package that uses a conductive clip and can lower the impedance of an output path.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor package comprising:
   a mounting frame having a conductive chip mounting region;
   a first semiconductor chip mounted on the chip mounting region and including a first semiconductor element in which a main current flows between a first main electrode and a second main electrode in a turn-on state;
   a second semiconductor chip mounted on the chip mounting region and including a second semiconductor element in which a main current flows between a third main electrode and a fourth main electrode in a turn-on state; and
   a conductive clip of a plate shape, including:
      a first component disposed above the mounting frame with the first semiconductor chip interposed between the first component and the mounting frame; and
      a second component separated from the first component and disposed above the mounting frame with the second semiconductor chip interposed between the second component and the mounting frame,
   wherein the second main electrode of the first semiconductor element and the third main electrode of the second semiconductor element are in contact with the chip mounting region, so that the first semiconductor element and the second semiconductor element are cascade-connected.

2. The semiconductor package of claim 1, wherein the mounting frame has a first power supply terminal and a second power supply terminal,
   wherein the first main electrode of the first semiconductor element and the first power supply terminal are electrically connected to each other via the first component of the conductive clip, and
   wherein the fourth main electrode of the second semiconductor element and the second power supply terminal are electrically connected to each other via the second component of the conductive clip.

3. The semiconductor package of claim 2, wherein the first power supply terminal is a terminal to which a power supply voltage for driving the first semiconductor element and the second semiconductor element is applied, and the second power supply terminal is a ground terminal, and
   wherein the first power supply terminal constitutes a part of a power supply device for supplying an output voltage in accordance with on/off operations of the first semiconductor element and the second semiconductor element.

4. The semiconductor package of claim 1, wherein the first semiconductor element and the second semiconductor element are vertical semiconductor elements, and
   wherein, in the first semiconductor chip, the first main electrode and the second main electrode are disposed on main surfaces which face each other, and
   wherein, in the second semiconductor chip, the third main electrode and the fourth main electrode are disposed on main surfaces which face each other.

5. The semiconductor package of claim 4, wherein the first semiconductor element is an n-channel type FET, and the first semiconductor chip is flip-chip mounted on the mounting frame such that the second main electrode faces the mounting frame, and
   wherein the second main electrode is a source of the first semiconductor element.

6. The semiconductor package of claim 4, wherein the second semiconductor element is an n-channel type FET, and the second semiconductor chip is flip-chip mounted on the mounting frame such that the third main electrode faces the mounting frame, and wherein the third main electrode is a drain of the second semiconductor element.

7. The semiconductor package of claim 1, wherein a controller chip including a control circuit, which is configured to control on/off operations of each of the first semiconductor element and the second semiconductor element, is mounted on the mounting frame.

8. The semiconductor package of claim 1, wherein the first semiconductor chip and the second semiconductor chip include first and second end portions, respectively, and wherein the conductive clip is bent with respect to the first and second end portions of the first semiconductor chip and the second semiconductor chip, respectively, and extends toward the mounting frame.

* * * * *